United States Patent
Kim et al.

(10) Patent No.: US 10,147,844 B2
(45) Date of Patent: Dec. 4, 2018

(54) QUANTUM DOT AND LIGHT EMITTING DIODE INCLUDING THE SAME

(71) Applicant: Samsung Display Co., Ltd., Yongin-si, Gyeonggi-do (KR)

(72) Inventors: Dong Chan Kim, Gunpo-si (KR); Yoon Hyeung Cho, Yongin-si (KR); Yi Su Kim, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/380,157

(22) Filed: Dec. 15, 2016

(65) Prior Publication Data

US 2017/0186909 A1  Jun. 29, 2017

(30) Foreign Application Priority Data

Dec. 29, 2015 (KR) .................. 10-2015-0188392

(51) Int. Cl.

| | |
|---|---|
| *H01L 33/06* | (2010.01) |
| *H01L 51/50* | (2006.01) |
| *C09K 11/02* | (2006.01) |
| *C09K 11/58* | (2006.01) |
| *C09K 11/60* | (2006.01) |
| *C09K 11/62* | (2006.01) |
| *C09K 11/66* | (2006.01) |

(Continued)

(52) U.S. Cl.
CPC ............ *H01L 33/06* (2013.01); *C09K 11/025* (2013.01); *C09K 11/582* (2013.01); *C09K 11/602* (2013.01); *C09K 11/621* (2013.01); *C09K 11/664* (2013.01); *C09K 11/71* (2013.01); *C09K 11/7428* (2013.01); *C09K 11/7492* (2013.01); *C09K 11/757* (2013.01); *C09K 11/88* (2013.01); *H01L 51/5004* (2013.01); *H01L 51/5056* (2013.01); *H01L 51/5072* (2013.01); *H01L 51/5096* (2013.01)

(58) Field of Classification Search
CPC . H01L 33/06; H01L 51/5056; H01L 51/5072; H01L 51/5096; H01L 51/5004; H01L 51/502; H01L 51/56; H01L 51/5092; C09K 11/025; C09K 11/883; C09K 11/565; B82Y 20/00; B82Y 30/00; H05B 33/14; Y10T 428/256
USPC ........ 438/35; 252/301.16; 427/66, 180, 384, 427/508; 428/690, 328, 917; 313/504, 313/506
See application file for complete search history.

(56) References Cited

U.S. PATENT DOCUMENTS

| 8,729,528 B2 | 5/2014 | Klem et al. | |
|---|---|---|---|
| 2003/0113709 A1* | 6/2003 | Alivisatos | B82Y 15/00 435/4 |

(Continued)

FOREIGN PATENT DOCUMENTS

| KR | 10-20080043829 A | 5/2008 |
|---|---|---|
| KR | 10-20130009141 A | 1/2013 |
| KR | 10-20140121351 A | 10/2014 |

*Primary Examiner* — Mouloucoulaye Inoussa
(74) *Attorney, Agent, or Firm* — Innovations Counsel LLP

(57) ABSTRACT

A quantum dot includes: a core including at least one first positive ion precursor and at least one negative ion precursor; a shell including at least one second positive ion precursor and at least one negative ion precursor and wrapping the core; and a ligand formed on a surface of the shell, wherein the first positive ion precursor is an n-period element and the second positive ion precursor is an (n-1)-period element, where n is an integer of 3 to 6.

8 Claims, 4 Drawing Sheets

(51) Int. Cl.
*C09K 11/71* (2006.01)
*C09K 11/74* (2006.01)
*C09K 11/75* (2006.01)
*C09K 11/88* (2006.01)

(56) References Cited

U.S. PATENT DOCUMENTS

| | | | |
|---|---|---|---|
| 2008/0122341 A1* | 5/2008 | Orita | B82Y 20/00 |
| | | | 313/503 |
| 2011/0227036 A1* | 9/2011 | Vaufrey | H01L 51/5016 |
| | | | 257/13 |
| 2011/0291071 A1 | 12/2011 | Kim et al. | |
| 2012/0138894 A1* | 6/2012 | Qian | H01L 51/502 |
| | | | 257/13 |
| 2016/0225947 A1* | 8/2016 | Murayama | H01L 33/06 |

* cited by examiner

QUANTUM DOT AND LIGHT EMITTING DIODE INCLUDING THE SAME

CROSS-REFERENCE TO RELATED APPLICATION

This application claims priority to and the benefit of Korean Patent Application No. 10-2015-0188392 filed in the Korean Intellectual Property Office on Dec. 29, 2015, the entire contents of which are incorporated herein by reference.

BACKGROUND (a) Technical Field

The present inventive concept relates to a quantum dot and a light-emitting device using the same.

(b) Description of the Related Art

A quantum dot represents a material having a crystal structure of a several nanometer size and includes several hundreds to thousands of atoms. This small material has a wide surface area per unit volume so most atoms are provided on the surface, and a quantum confinement effect appears so the material has electrical, magnetic, optical, chemical, and mechanical characteristics that are different from unique characteristics of the material. That is, it becomes possible to control various characteristics by controlling a size of the quantum dot.

When the quantum dot is arranged on a substrate, a highly integrated element may be manufactured, and quantum dot light-emitting devices using quantum dots other than an organic emission material as the material for the emission layer have been recently researched. The quantum dot light-emitting device may control the size of the quantum dot to realize desired natural colors, it has excellent color reproducibility, and it has luminance that is as good as that of the light emitting diode (LED) so it is being paid attention as a material for supplementing the drawback of the light emitting diode (LED) highlighted as a next-generation light source.

The above information disclosed in this Background section is only for enhancement of understanding of the background of the inventive concept and therefore it may contain information that does not form the prior art that is already known in this country to a person of ordinary skill in the art.

SUMMARY

The present inventive concept has been made in an effort to provide a cadmium-free quantum dot and a stability-improved light-emitting device. An exemplary embodiment of the present inventive concept provides a quantum dot including: a core including at least one first positive ion precursor and at least one negative ion precursor; a shell including at least one second positive ion precursor and at least one negative ion precursor and wrapping the core; and a ligand formed on a surface of the shell, wherein the first positive ion precursor is an n-period element and the second positive ion precursor is an (n-1)-period element, where n is an integer of 3 to 6.

A HOMO energy level and a LUMO energy level of the shell may be different from a HOMO energy level and a LUMO energy level of the core by equal to or less than 2.0 eV, respectively.

The first positive ion precursor may include at least one of Al, Fe, Co, Cu, Zn, Ga, In, Ag, Pb, Bi, and Tl.

The negative ion precursor may include at least one of Te, I, O, S, Se, N, P, As, and Sb.

The core may include at least one of $PbI_2$, $BiI_3$, $Fe_2O_3$, CoO, CuO, $Cu_2O$, AgO, $Ag_2O$, CuS, $Cu_2S$, $Ag_2S$, $In_2S_3$, $Bi_2S_3$, CuSe, $Cu_2Se$, AgSe, $Ga_2Se_3$, $In_2Se_3$, TlSe, $Cu_2Te$, ZnTe, $Cu_3N$, $Zn_3P_2$, GaP, InP, AlAs, GaAs, and AlSb.

The core may have a size of about 2 nm to 10 nm.

Another embodiment of the present inventive concept provides a light-emitting device including: a first electrode; a second electrode facing the first electrode; and an emission layer provided between the first electrode and the second electrode, wherein the emission layer includes a core including at least one first positive ion precursor and at least one negative ion precursor, a shell including at least one second positive ion precursor and at least one negative ion precursor and wrapping the core, and a ligand formed on a surface of the shell, wherein the first positive ion precursor is an n-period element and the second positive ion precursor is an (n-1)-period element, where n is an integer of 3 to 6.

The light-emitting device may further include a hole transport layer disposed between the first electrode and the emission layer, and an electron transport layer disposed between the emission layer and the second electrode.

The light-emitting device may include a quantum dot in which a HOMO energy level and a LUMO energy level of the shell are different from a HOMO energy level and a LUMO energy level of the core by equal to or less than 2.0 eV, respectively.

The first positive ion precursor may include at least one of Al, Fe, Co, Cu, Zn, Ga, In, Ag, Pb, Bi, and Tl.

The negative ion precursor may include at least one of Te, I, O, S, Se, N, P, As, and Sb.

The core may include at least one of $PbI_2$, $BiI_3$, $Fe_2O_3$, CoO, CuO, $Cu_2O$, AgO, $Ag_2O$, CuS, $Cu_2S$, $Ag_2S$, $In_2S_3$, $Bi_2S_3$, CuSe, $Cu_2Se$, AgSe, $Ga_2Se_3$, $In_2Se_3$, TlSe, $Cu_2Te$, ZnTe, $Cu_3N$, $Zn_3P_2$, GaP, InP, AlAs, GaAs, and AlSb.

The hole transport layer may include a p-doped compound of the compound included in the core, the p-doped compound being doped with a metal, a non-metal, or a halogen element, and the electron transport layer may include an n-doped compound of the compound included in the core, the n-doped compound being doped with a metal, a non-metal, or a halogen element.

The light-emitting device may further include a blocking layer, and the blocking layer may be provided between the hole transport layer and the emission layer and/or between the emission layer and the electron transport layer.

The blocking layer may include a first-group metal based halide compound or a second-group metal based halide compound.

The blocking layer may be 0.5 nm to 5 nm thick.

The quantum dot according to the exemplary embodiment of the present inventive concept provides the cadmium-free quantum dot and is environmentally friendly.

Further, the light-emitting device according to the exemplary embodiment of the present inventive concept may solve the charge balance defect of holes and electrons that was a conventional problem, thereby improving stability through a reduction of degradation of elements and an increase of lifespan.

DETAILED DESCRIPTION

Figure 1:
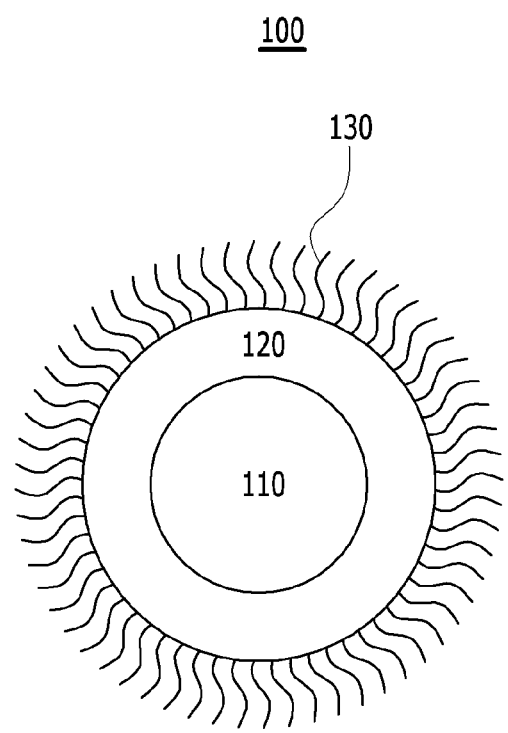
FIG. 1 shows a cross-sectional view of a quantum dot according to an exemplary embodiment of the present inventive concept.

The present inventive concept will be described more fully hereinafter with reference to the accompanying drawings, in which exemplary embodiments of the inventive concept are shown. As those skilled in the art would realize, the described embodiments may be modified in various different ways, all without departing from the spirit or scope of the present inventive concept.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

A quantum dot according to an exemplary embodiment of the present inventive concept and a light-emitting device including the same will be described in detail with reference to accompanying drawings.

A quantum dot according to an exemplary embodiment of the present inventive concept will now be described.

The quantum dot 100 includes a core 110 including at least one first positive ion precursor and at least one negative ion precursor, a shell 120 including at least one second positive ion precursor and at least one negative ion precursor and wrapping the core, and a ligand 130 generated on a surface of the shell 120.

The first positive ion precursor included in the core 110 represents an n-period element of a periodic table of elements, and the n is an integer of 3 to 6. In detail, in the present exemplary embodiment, it is desirable for the first positive ion precursor to include at least one of aluminum (Al), iron (Fe), cobalt (Co), copper (Cu), zinc (Zn), gallium (Ga), indium (In), silver (Ag), lead (Pb), bismuth (Bi), and thallium (Tl).

Further, the negative ion precursor included in the core 110 and the shell 120 may include at least one of an iodide, an oxide, a sulfide, a selenide, a telluride, a nitride, a phosphide, an arsenide, and an antimonide, which may be selected in an appropriate manner depending on the first positive ion precursor or the second positive ion precursor. In detail, the negative ion precursor may include at least one of nitrogen (N), phosphorus (P), arsenic (As), antimony (Sb), oxygen (O), sulfur (S), selenium (Se), tellurium (Te), and iodine (I).

That is, the core 110 may be a binary core including at least one of $PbI_2$, $BiI_3$, $Fe_2O_3$, $CoO$, $CuO$, $Cu_2O$, $AgO$, $Ag_2O$, $CuS$, $Cu_2S$, $Ag_2S$, $In_2S_3$, $Bi_2S_3$, $CuSe$, $Cu_2Se$, $AgSe$, $Ga_2Se_3$, $In_2Se_3$, $TlSe$, $Cu_2Te$, $ZnTe$, $Cu_3N$, $Zn_3P_2$, $GaP$, $InP$, $AlAs$, $GaAs$, and $AlSb$, and without being limited to this, it may be a ternary core or a quaternary core.

The quantum dot 100 does not include a material such as cadmium (Cd) and mercury (Hg) which are used for realizing the light-emitting device with a high photoluminescence quantum yield and a narrow full width at half maximum. The light-emitting device that does not include cadmium (Cd) and mercury (Hg), which destroy environment, is a good way to solve the environmental problem.

The core 110 may exhibit various kinds of colors according to a composition ratio, that is, contents of the first positive ion precursor and/or the negative ion precursor in the binary core, and may control emitted colors by changing a size of the core 110. Accordingly, the quantum dot 100 may have various kinds of emitted colors such as blue, red, or green.

In detail, in the present exemplary embodiment, a diameter of the core 110 is about 2 nm to 10 nm.

The shell 120 according to an exemplary embodiment of the present inventive concept substantially wraps a surface of the core 110 so as to protect the core 110. When the first positive ion precursor included in the core 110 is an n-period element, the second positive ion precursor included in the shell 120 of the present exemplary embodiment is an (n-1)-period element. Further, the negative ion precursor included in the shell 120 may include at least one of an iodide, an oxide, a sulfide, a selenide, a telluride, a nitride, a phosphide, an arsenide, and an antimonide. For example, the shell 120 may be a binary shell including at least one of MgTe, MgSe, MgO, and MgS, and without being restricted to this, it may be a ternary shell and a quaternary shell.

Accordingly, a highest occupied molecular orbital (HOMO) energy level and a lowest unoccupied molecular orbital (LUMO) energy level of the shell 120 have a difference that is equal to or less than 2.0 eV from a HOMO energy level and a LUMO energy level of the core 110, respectively.

A ligand 130 is formed on the surface of the shell 120. The ligand 130 may include an organic functional group, and it may be provided on the surface of the shell 120 and be chemically combined to the shell 120. The organic functional group may include at least one of a trioctyl phosphine (TOP), a trioctyl phosphine oxide (TOPO), a zinc carboxylate, a carboxylic acid, an amine, a phosphonic acid, and a mixture thereof. In the present exemplary embodiment, the ligand 130 helps dispersion of the quantum dot 100 in a non-polar solvent when the quantum dot 100 is formed.

Figure 2:
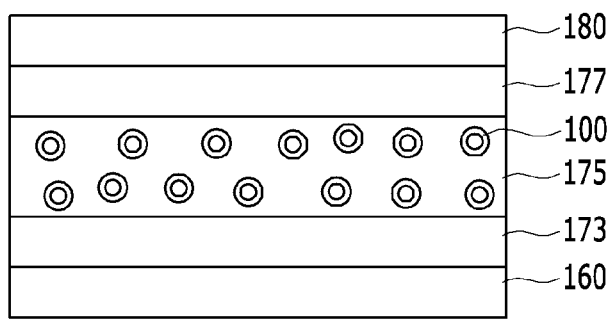
FIG. 2 shows a cross-sectional view of a light-emitting device according to an exemplary embodiment of the present inventive concept.

FIG. 2 shows a cross-sectional view of a light-emitting device according to an exemplary embodiment of the present inventive concept.

A light-emitting device including a quantum dot 100 according to an exemplary embodiment of the present inventive concept will now be described with reference to FIG. 2.

Referring to FIG. 2, the light-emitting device includes a first electrode 160, a hole transport layer 173, an emission layer 175, an electron transport layer 177, and a second electrode 180.

When the first electrode 160 is an anode, the first electrode 160 may be formed by using a material that is selected from those with a high work function so as to easily inject holes. The first electrode 160 may be a transparent electrode or a non-transparent electrode.

When the first electrode 160 is a transparent electrode, the first electrode 160 may include a conductive oxide such as an indium-tin oxide (ITO), an indium-zinc oxide (IZO), a zinc-tin oxide (ZTO), a copper-indium oxide (CIO), a copper-zinc oxide (CZO), a gallium-zinc oxide (GZO), an aluminum-zinc oxide (AZO), or a combination thereof, or it may include a thin metal such as yttrium, aluminum, silver, or magnesium. The first electrode 160 that is a transparent electrode may include a multi-layered structure combined with a conductive oxide and a metal or a multi-layered structure configured with one of a conductive oxide and a metal. When the first electrode 160 is a non-transparent electrode, the first electrode 160 may include a metal such as aluminum, silver, or magnesium.

Further, the first electrode 160 may be formed of a graphene, a carbon nanotube, and a conductive polymer (PEDOT:PSS).

Regarding the exemplary embodiment in which light generated by the emission layer 175 is emitted toward a direction of the second electrode 180 from the first electrode 160, the first electrode 160 may include a reflective layer made of silver (Ag), aluminum (Al), magnesium (Mg), chromium (Cr), molybdenum (Mo), tungsten (W), titanium (Ti), gold (Au), palladium (Pd), or their alloys. Further, the first electrode 160 may include a multi-layered structure by providing a transparent electrode material layer made of an ITO, IZO or ZnO over or below the reflective layer or providing them on both side of the reflective layer.

The first electrode 160 may be formed by a solution process, a chemical vapor deposition (CVD), a physical vapor deposition (PVD), or a thermal evaporation.

The second electrode 180 faces the first electrode 160.

When the second electrode 180 is a cathode, it may include a material with a small work function so as to easily inject the electrons. In detail, the material may be a metal such as magnesium, calcium, sodium, potassium, titanium, indium, yttrium, lithium, gadolinium, aluminum, silver, tin, lead, cesium, or barium or their alloys, or it may be a multi-layered material such as LiF/Al, $LiO_2$/Al, LiF/Ca, LiF/Al, and $BaF_2$/Ca, but it is not limited thereto.

When the second electrode 180 is made of an alloy, a composition ratio of the alloy is controllable by a temperature, an atmosphere, and a vacuum level, and may be selected to have an appropriate ratio.

The second electrode 180 may include a plurality of layers.

The emission layer 175 is provided between the first electrode 160 and the second electrode 180.

The holes and electrons provided by the hole transport layer 173 and the electron transport layer 177 to be described are recombined in the emission layer 175, and, thus, emits light. The emission layer may be an inorganic emission layer 175 including the above-described quantum dot 100 according to an exemplary embodiment of the present inventive concept. That is, the light-emitting device according to an exemplary embodiment of the present inventive concept does not include the material such as cadmium as the quantum dot 100, which destroy environment, but includes an environmentally-friendly quantum dot 100.

In the present exemplary embodiment, the emission layer 175 may be about 10 nm to 50 nm thick, and it may be formed by the solution process, the chemical vapor deposition (CVD), the physical vapor deposition (PVD), or the thermal evaporation.

The hole transport layer 173 is provided between the first electrode 160 and the emission layer 175. The hole transport layer 173 may smoothly transport the holes from the anode 160 to the emission layer 175, and may include the same compound as the core material included in the above-noted quantum dot 100.

In detail, the hole transport layer 173 is a p-type transport layer. In further detail, the hole transport layer 173 includes a material for transporting p-type doped holes. The hole transport layer 173 includes a p- doped compound of the compound included in the core 110 of the quantum dot 100. The p-doped compound is doped with a metal, a non-metal, or a halogen element. The hole transport layer 173 includes compounds such as p-ZnTe, p-ZnSe, and p-ZnS.

In the present exemplary embodiment, the metal or the non-metal as a p-type dopant may be changed depending on the core material. For example, when the first positive ion precursor included in the core 110 is a divalent element, a univalent element is doped as the p-type dopant, and when the negative ion precursor included in the core 110 is a (−) divalent element, a (−) trivalent element is doped as the p-type dopant.

In detail, the hole transport layer 173 includes a p-type dopant including at least one of copper (Cu), silver (Ag), gold (Au), nitrogen (N), phosphorus (P), arsenic (As), and antimony (Sb) by which conductivity thereof is improved.

The hole transport layer 173 may be formed by the solution process, the chemical vapor deposition (CVD), the physical vapor deposition (PVD), and the thermal evaporation.

The electron transport layer 177 is provided between the emission layer 175 and the second electrode 180. The electron transport layer 177 may transport the electron to the emission layer 175 from the second electrode 180. Further, the electron transport layer 177 may prevent the holes injected by the first electrode 160 from passing through the emission layer 175 and moving to the second electrode 180. That is, the electron transport layer 177 functions as a hole blocking layer to help recombination of holes and electrons in the emission layer 175.

The electron transport layer 177 may include the same compound as the core material included in the quantum dot 100. In detail, the electron transport layer 177 is an n-type transport layer. In further detail, the electron transport layer 177 includes a material for transporting n-type doped electrons. In detail, the electron transport layer 177 includes an n-doped compound of the compound included in the core 110 of the quantum dot 100. The n-doped compound is doped with a metal, a non-metal, or a halogen element. The electron transport layer 177 includes compounds such as n-ZnSe, n-ZnS, and n-ZnO.

In the present exemplary embodiment, the metal or the non-metal as an n-type dopant may be changed depending on the core material. For example, when the first positive ion precursor included in the core 110 is a divalent element, a trivalent element is doped as the n-type dopant, and when the negative ion precursor is a (−) divalent element, i a (−) univalent element is doped as the n-type dopant.

In detail, the electron transport layer 177 includes an n-type dopant including at least one of boron (B), aluminum (Al), gallium (Ga), indium (In), thallium (Tl), fluorine (F), chlorine (CO, bromine (Br), and iodine (I), by which conductivity thereof is improved.

The electron transport layer 177 may be formed by the solution process, the chemical vapor deposition (CVD), the physical vapor deposition (PVD), and the thermal evaporation.

The light-emitting device according to the exemplary embodiment of the present inventive concept includes the same inorganic material as the hole transport layer 173, the electron transport layer 177, and the core of the quantum dot of the emission layer, thereby reduces degradation of elements and increase a lifespan as compared to the conventional light-emitting device which includes an organic hole transporting layer.

Figure 3:
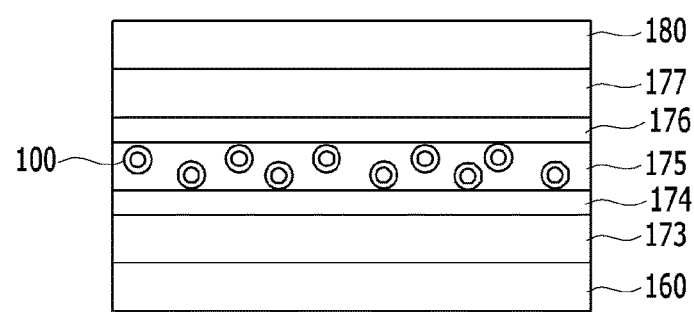
FIG. 3 shows a cross-sectional view of a modified light-emitting device of FIG. 2 according to an exemplary embodiment of the present inventive concept.

FIG. 3 shows a cross-sectional view of a modified light-emitting device of FIG. 2 according to an exemplary embodiment of the present inventive concept.

FIG. 3 shows that a plurality of blocking layers 174 and 176 are added to the light-emitting device according to an exemplary embodiment of FIG. 2. In detail, the blocking layers 174 and 176 are respectively provided between the hole transport layer 173 and the emission layer 175 and between the emission layer 175 and the electron transport layer 177.

The blocking layers 174 and 176 include a first-group metal based halide compound or a second-group metal based halide compound. For example, the blocking layers 174 and 176 may include LiI, NaI, KI, RbI, and CsI.

The blocking layers 174 and 176 are not restricted to the configuration shown in FIG. 3, and at least one thereof may be formed on an interface of a light-emitting device layer shown in FIG. 2. That is, the blocking layers 174 and 176 are provided on the interfaces of the emission layer 175 and the electron transport layer 177, and/or the hole transport layer 173, thereby controlling tunneling of electrons and/or holes and, as a result, controlling a charge balance of the light-emitting device.

In this instance, the tunneling of electrons and/or holes may be controlled by appropriately controlling the thickness of the blocking layers 174 and 176, and as the thickness becomes greater, an effect as an energy barrier increases.

In detail, it is desirable for the blocking layers 174 and 176 to be about 0.5 nm to 5.0 nm thick. When the blocking layer is less than about 0.5 nm thick, the effect as the blocking layer is weak, and when it is greater than about 5.0 nm thick, the mobility of holes and/or electrons to the emission layer may be substantially deteriorated.

A charge balance controlling effect according to an exemplary embodiment of the present inventive concept will now be described.

Figure 4:
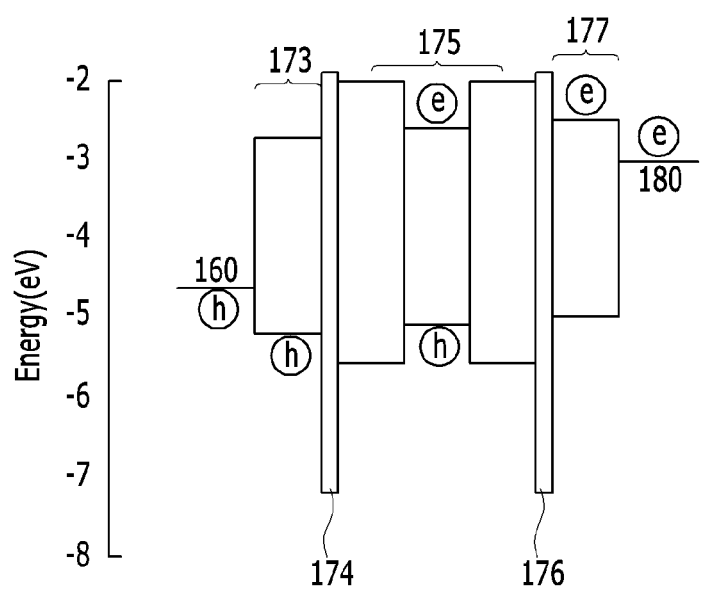
FIG. 4 shows a schematic view of a band gap energy level of a light-emitting device according to an exemplary embodiment of the present inventive concept.

FIG. 4 shows a schematic view of a band gap energy level of a light-emitting device according to an exemplary embodiment of the present inventive concept.

Referring to FIG. 3 and FIG. 4, the light-emitting device includes a first electrode 160 made of an ITO, a p-type hole transport layer 173, a first blocking layer 174, an emission layer 175 including a core-shell structured quantum dot, a second blocking layer 176, an n-type electron transport layer 177, and a second electrode 180 made of Yb/AgMg.

In detail, FIG. 4 shows an emission layer 175 including a quantum dot 100 of ZnTe/MgTe. In the present exemplary embodiment, the quantum dot 100 has the ZnTe as the core 110 and has the MgTe as the shell 120 which has the same crystal structure as the core 110. That is, the quantum dot 100 has a core of ZnTe wrapped with a shell of the MgTe. A band gap energy of the shell 120 is greater than a band gap energy of the core 110. Referring to FIG. 4, the band gap energy of the ZnTe that is the core 110 is about 2.26 eV, and the band gap energy of the MgTe that is the shell is about 3.5 eV.

It is desirable for the band gap energy of the core 110 according to an exemplary embodiment of the present inventive concept to be about 1.2 eV to 3.5 eV, and the band gap energy of the shell 120 to be about 2.6 eV to 4.0 eV.

Further, a first blocking layer 174 is provided between the hole transport layer 173 including a p-type ZnTe and the emission layer 175 as a p-type hole transport layer 173, and a second blocking layer 176 is provided between the electron transport layer 177 including an n-type ZnTe and the emission layer 175 as an n-type electron transport layer 177. In detail, it may be found that a band gap energy difference between the hole transport layer 173 and the emission layer 175 is greater than a band gap energy difference between the electron transport layer 177 and the emission layer 175. Accordingly, the hole transport layer 173 and the electron transport layer 177 include the first blocking layer 174 and/or the second blocking layer 176, respectively, at interfaces with the emission layer 175 thereby efficiently controlling a tunneling amount of holes and/or electrons injected into the emission layer 175.

In the conventional quantum dot light-emitting device, more electrons than the holes are injected into the quantum dot emission layer because of a difference in mobility between the electrons and the holes, and the balance of the holes and the electrons injected into the emission layer is destroyed, so the emission efficiency is deteriorated. Further, the band gap energy difference between the emission layer and the hole transport layer is greater than the band gap energy difference between the emission layer and the electron transport layer so more electrons than holes are injected into the quantum dot.

In the case of the light-emitting device according to the present exemplary embodiment, the first blocking layer 174 and/or the second blocking layer 176 is appropriately disposed in consideration of the energy barrier of the hole transport layer 173 and/or the electron transport layer 177 and the emission layer 175, increasing the electron injection barrier, lowering the hole injection barrier to control the charge balance, and increasing the stability of the light-emitting device according to the present exemplary embodiment.

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A light-emitting device comprising:
a first electrode;
a second electrode facing the first electrode;
an emission layer provided between the first electrode and the second electrode,
wherein the emission layer includes a core including at least one first positive ion precursor and at least one negative ion precursor, a shell including at least one second positive ion precursor and at least one negative ion precursor and wrapping the core, and a ligand formed on a surface of the shell, and wherein the first positive ion precursor is an n-period element and the second positive ion precursor is an (n-1)-period element, where n is an integer of 3 to 6;
a hole transport layer disposed between the first electrode and the emission layer; and
an electron transport layer disposed between the emission layer and the second electrode,
wherein the hole transport layer, the electron transport layer and the core of the emission layer include a same inorganic material,
wherein the hole transport layer includes a p-doped compound of the compound included in the core, the p-doped compound being doped with a metal, a non-metal, or a halogen element, and
the electron transport layer includes an n-doped compound of the compound included in the core, the n-doped compound being doped with a metal, a non-metal, or a halogen element.

2. The light-emitting device of claim 1, wherein the light-emitting device includes a quantum dot in which a HOMO energy level and a LUMO energy level of the shell are different from a HOMO energy level and a LUMO energy level of the core by equal to or less than 2.0 eV, respectively.

3. The light-emitting device of claim 2, wherein
the first positive ion precursor includes at least one of Al, Fe, Co, Cu, Zn, Ga, In, Ag, Pb, Bi, and Tl.

4. The light-emitting device of claim 3, wherein
the at least one negative ion precursor includes at least one of Te, I, O, S, Se, N, P, As, and Sb.

5. The light-emitting device of claim 4, wherein
the core includes at least one of PbI2, BiI3, Fe2O3, CoO, CuO, Cu2O, AgO, Ag2O, CuS, Cu2S, Ag2S, In2S3, Bi2S3, CuSe, Cu2Se, AgSe, Ga2Se3, In2Se3, TlSe, Cu2Te, ZnTe, Cu3N, Zn3P2, GaP, InP, AlAs, GaAs, and AlSb.

6. The light-emitting device of claim 5, wherein
the light-emitting device further includes a blocking layer, and
the blocking layer is provided between the hole transport layer and the emission layer and/or between the emission layer and the electron transport layer.

7. The light-emitting device of claim 6, wherein
the blocking layer includes a first-group metal based halide compound or a second-group metal based halide compound.

8. The light-emitting device of claim 7, wherein
the blocking layer is 0.5 nm to 5 nm thick.

\* \* \* \* \*